United States Patent
Zhou et al.

(10) Patent No.: US 8,553,452 B2
(45) Date of Patent: Oct. 8, 2013

(54) METHOD FOR MAGNETIC SCREENING OF ARRAYS OF MAGNETIC MEMORIES

(75) Inventors: Yuchen Zhou, San Jose, CA (US); Ebrahim Abedifard, Sunnyvale, CA (US); Yiming Huai, Pleasanton, CA (US)

(73) Assignee: Avalanche Technology Inc., Fremont, CA (US)

( * ) Notice: Subject to any disclaimer, the term of this patent is extended or adjusted under 35 U.S.C. 154(b) by 136 days.

(21) Appl. No.: 13/314,470

(22) Filed: Dec. 8, 2011

(65) Prior Publication Data

US 2013/0148417 A1    Jun. 13, 2013

(51) Int. Cl.
*G11C 11/16* (2006.01)

(52) U.S. Cl.
USPC .......................... 365/158; 257/200

(58) Field of Classification Search
None
See application file for complete search history.

(56) References Cited

U.S. PATENT DOCUMENTS

| | | | |
|---|---|---|---|
| 6,744,086 B2 | 6/2004 | Daughton et al. | |
| 2005/0133822 A1* | 6/2005 | DeHerrera et al. | 257/200 |

OTHER PUBLICATIONS

Jasson Janesky, Impact of External Magnetic Fields on MRAM Products, Freescale Semiconductor Application Note AN3525 Rev. 0, Nov. 2007; On the Internet at http://cache.freescale.com/files/32bit/doc/app_note/AN3525.pdf.

* cited by examiner

*Primary Examiner* — Hoai V Ho
*Assistant Examiner* — James G Norman
(74) *Attorney, Agent, or Firm* — G. Marlin Knight

(57) ABSTRACT

A testing method is described that applies a sequence external magnetic fields of varying strength to MRAM cells (such as those with MTJ memory elements) in chips or wafers to selectively screen out cells with low or high thermal stability factor. The coercivity (Hc) is used as a proxy for thermal stability factor (delta). In the various embodiments the sequence, direction and strength of the external magnetic fields is used to determine the high coercivity cells that are not switched by a normal field and the low coercivity cells that are switched by a selected low field. In some embodiment the MRAM's standard internal electric current can be used to switch the cells. Standard circuit-based resistance read operations can be used to determine the response of each cell to these magnetic fields and identify the abnormal high and low coercivity cells.

21 Claims, 12 Drawing Sheets

Low Delta Cell

Low Delta Cell

High Delta Cell

High Delta Cell

Low Delta Cell

Non-switchable Cell

Low Delta Cell

METHOD FOR MAGNETIC SCREENING OF ARRAYS OF MAGNETIC MEMORIES

FIELD OF THE INVENTION

The present invention relates to the techniques for testing or screening arrays of magnetoresistive random access memory (MRAM) cells such as those including magnetic tunnel junctions (MTJ) memory elements.

BACKGROUND OF THE INVENTION

Two types of magnetoresistive random access memory (MRAM) cells including magnetic tunnel junctions (MTJ) memory elements will be described as examples of devices that can be used with the method of the invention. FIG. 1A illustrates an MRAM cell 10H which is designed for in-plane magnetization of the MTJ layer structure 200 with respect to the film surface. The MTJ 200 in this example includes a free magnetic layer 11, a nonmagnetic spacer or junction layer 12, a reference magnetic layer 13, an antiferromagnetic exchange coupling layer 14, a pinned magnetic layer 15 and an antiferromagnetic layer 16. An MRAM cell structure typically includes a top metal contact 21 and a bottom metal contact 22. The metal contacts are also referred to as electrodes. The reference magnetic layer 13 is antiferromagnetically exchange coupled to the pinned magnetic layer 15, which has a fixed magnetization direction. The free magnetic layer has a magnetization direction that is switchable in either of two directions. The resistivity of the whole MTJ layer stack changes when the magnetization of the free layer changes direction relative to that of the reference layer, exhibiting a low resistance state when the magnetization orientation of the two ferromagnetic layers is substantially parallel and a high resistance when they are anti-parallel. Therefore, the cells have two stable states that allow the cells to serve as non-volatile memory elements.

The MRAM cells in an array on a chip are connected by metal word and bit lines (not shown). Each memory cell is connected to a word line and a bit line. The word lines connect rows of cells, and bit lines connect columns of cells. Typically CMOS structures 24 include a selection transistor which is electrically connected to the MTJ stack through the top or bottom metal contacts. The direction of the current flow is between top or bottom metal contacts.

Reading the state of the cell is achieved by detecting whether the electrical resistance of the cell is in the high or low state. Writing the cells requires a sufficiently high DC current flowing in the direction through the MTJ stack between the top and bottom metal contacts to induce a spin transfer torque that orients (switches) the free layer into the desired direction. The amount of current needed to write the cells is at least slightly higher than the current that flows during the read process, so that a read operation does not change the state of the cell.

FIG. 1B illustrates another type of MRAM cell 10P which is designed for perpendicular magnetization of the MTJ layer structure 200P with respect to the film surface, but otherwise the discussion above of the in-plane example of FIG. 1A can be applied to the perpendicular MTJ example. The example of FIG. 1B does not include antiferromagnetic layer 16.

FIG. 1A and FIG. 1B show example structures of the in-plane and perpendicular MTJ structures used in MRAM devices. However, the novel method as disclosed by this invention can apply to other in-plane and perpendicular MTJ structures, as long as there is a magnetic storage (free) layer and a magnetic reference layer in such structures, without being limited to FIG. 1A and FIG. 1B structures.

Functional MRAM devices are tested by writing and reading selected patterns in the memory similar to other memory devices. Unlike older memory devices MRAM integrated circuits are susceptibility to external magnetic fields. A method of testing MRAM integrated circuits for susceptibility to external magnetic fields is described in a Freescale Semiconductor Application Note AN3525 Rev. 0, November 2007 by Jason Janesky. The magnetic fields are generated by a quadruple magnet capable of producing magnetic fields of several hundred gauss in any direction within the plane of the part being tested. A Helmholtz coil pair is also used to generate a magnetic field perpendicular to the part. Performance of the MRAM parts is measured versus applied field during part operation and after application of external fields. Typical tests were described as including testing the part for errors while applying a field at various angles and again after returning the field to 0 gauss to determine destructive error rate. The field was increased in five gauss steps until failures were observed. Because the free layers in MRAMs are susceptible to large external magnetic fields, magnetic shielding around the whole chip may be provided.

Reducing the minimum separation or minimum critical dimension (CD) between two adjacent MRAM memory cells, such as MTJ cells, on a substrate is a priority in MRAM research and development. MRAM technology is currently being developed with minimum CD below 30 nm and even the 10 nm regime is being explored. Thermal stability of the MTJ cell tends to decrease with the size of the cells. The thermal stability of the MTJ cell can be described by the thermal stability factor (delta): $\Delta=K_u V/k_B T$ (where $K_u$ is the anisotropy energy density of the storage (free) magnetic layer, V being the volume of the storage (free) magnetic layer, $k_B$ being Boltzmann constant, T being absolute temperature in Kelvin). The thermal stability factor will also be called the "delta" of the cell herein. The thermal stability factor of the cells will inevitably show larger variation across a wafer or between neighboring cells in the manufacturing process. This is partially due to the varying size of the MTJ element, which is determined by the MRAM processing procedures, and becomes a larger percentage of the final CD as the CD becomes smaller. It is also partially due to the magnetic film of the MTJ element having a smaller number of magnetic grains at smaller MTJ cell sizes that makes the free layer magnetic properties, for example anisotropy field $H_k$, show larger variation because the averaging effect declines with the number grains.

The larger variation of the thermal stability gives rise of the possibility of existence of both high $\Delta$ (delta) cells that are not switchable with normal program current, and low $\Delta$ cells that are easily switchable with program current but are not sufficiently stable to hold stored data as long as required. For the MRAM chip to be functional, these defective cells must be detected and screened out.

The high $\Delta$ cells are relatively easy to screen out with standard on-chip circuitry based testing methods, because they do not switch when normal programming electrical current flows through the cell. These "un-switchable" cells can be detected by writing known data patterns and reading the resulting data bits.

Identifying the low $\Delta$ cells that are switchable but unstable is more problematic using pure circuit based methods and may be impractical due to the need for a complicated test algorithm and the relatively long time required to run such a test on every cell of a production MRAM chip by pure circuit based screening method alone.

Therefore, it is desirable to have a method that efficiently screens out both high Δ and low Δ MRAM MTJ cells.

SUMMARY OF THE INVENTION

Embodiments of the invention test MRAM cells such as those with MTJ memory elements by applying a sequence external magnetic fields of varying strength and direction. In the various embodiments the sequence and strength of the external magnetic fields are selected to identify and screen out both high and low thermal stability factor (delta) cells by determining which cells are not switched by a selected high field and which cells are switched by a selected low field. The method exploits the correlation between the thermal stability and the coercivity (Hc) of the MTJ storage (free) layer. The coercivity (Hc) is used as a proxy for thermal stability factor (delta) in embodiments of the invention. Therefore, in the text herein "delta" will sometimes be used interchangeably with Hc when describing the method. The external fields can be applied to all of the memory cells in one or more MRAM wafers or chips simultaneously, which increases the efficiency. Standard circuit-based resistance read operations can be used to determine the response of each cell to these magnetic fields and, thereby identify the abnormal high and low delta cells. The invention can be used with any type of MRAM that includes magneto-resistive elements. The described embodiments reference MTJ devices, but other MRAM devices such as GMR or AMR can be tested by embodiments of the invention.

By applying a magnetic field that is selected to cause (or force) the free layer in normal cells (e.g. those within the design specifications) and low Hc (and, therefore, low delta) cells to switch magnetic states if they are not already in the target state, the high Hc (and, therefore high delta) MTJ cells that do not switch can be identified. Similarly by applying a magnetic field that is selected to be below the strength that should cause the free layer in cells with normal Hc to switch, the low delta MTJ cells that do switch (when they should not) are identified. This enables fast screening with high confidence and reduces the time and cost of chip characterization and testing. In some embodiments in one of the steps the normal and low delta cells can be switched using the normal electrical write current instead of an external magnetic field.

In one embodiment both high and low delta cells are identified by first applying a high external field to switch all cells (including high delta cells) to a known state. Next a second field oriented in the opposite direction is applied. This second field is weaker than the first field and is selected to switch only normal and low delta cells. A third field is then applied in the opposite direction from the second field. The third field is weaker still and is selected to only switch low delta cells. The resulting state of the set of cells is that both low and high delta cells will be oriented in one resistance state while the normal cells will have the opposite resistance state. A normal read operation can then distinguish the normal cells from the cells with either high or low delta.

DETAILED DESCRIPTION OF THE INVENTION

In the following description of the embodiments, reference is made to the accompanying drawings that form a part hereof, and in which is shown by way of illustration of the specific embodiments in which the invention may be practiced. It should be noted that the figures discussed herein are not drawn to scale and do not indicate actual or relative sizes. The hatching in the figures does not represent the type of material used.

Figure 1A:
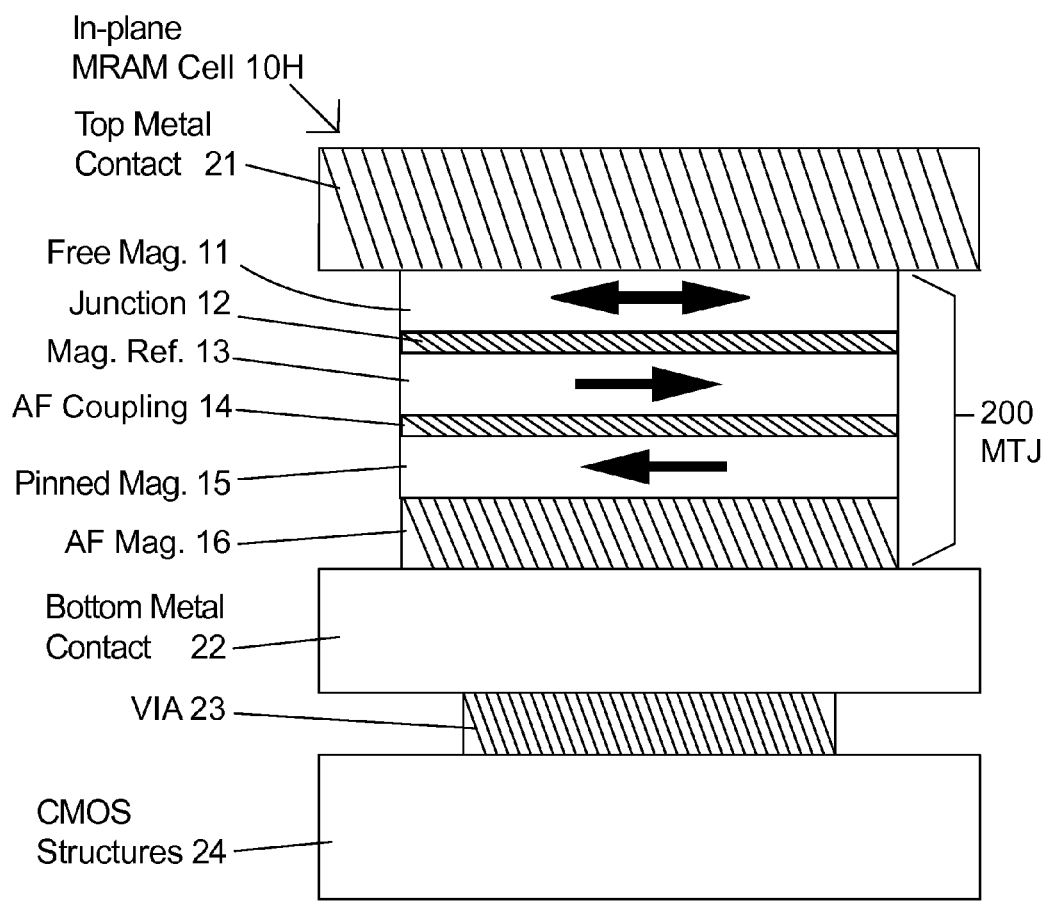
FIG. 1A is an illustration of an MRAM cell including MTJ memory element designed for in-plane magnetization of the MTJ layer structure that can be used with the method embodiments of the invention.
Figure 1B:
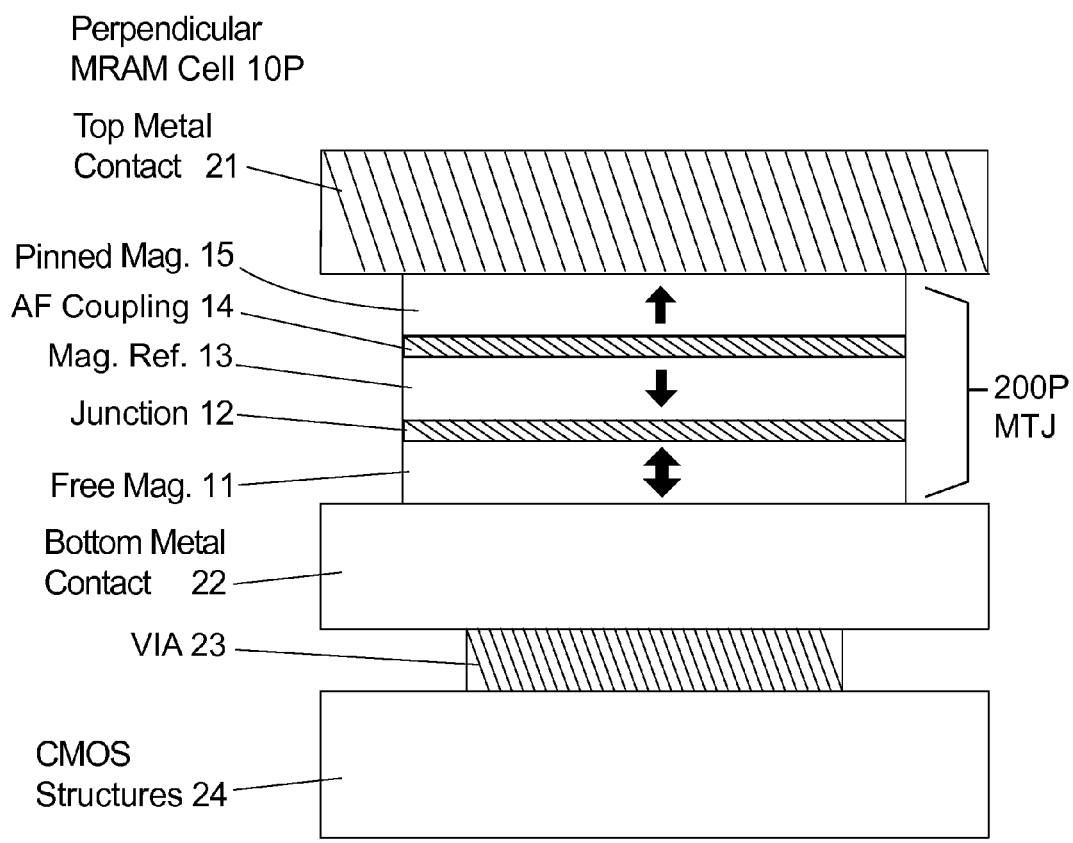
FIG. 1B is an illustration of an MRAM cell including MTJ memory element designed for perpendicular magnetization of the MTJ layer structure that can be used with the method embodiments of the invention.
Figure 2:
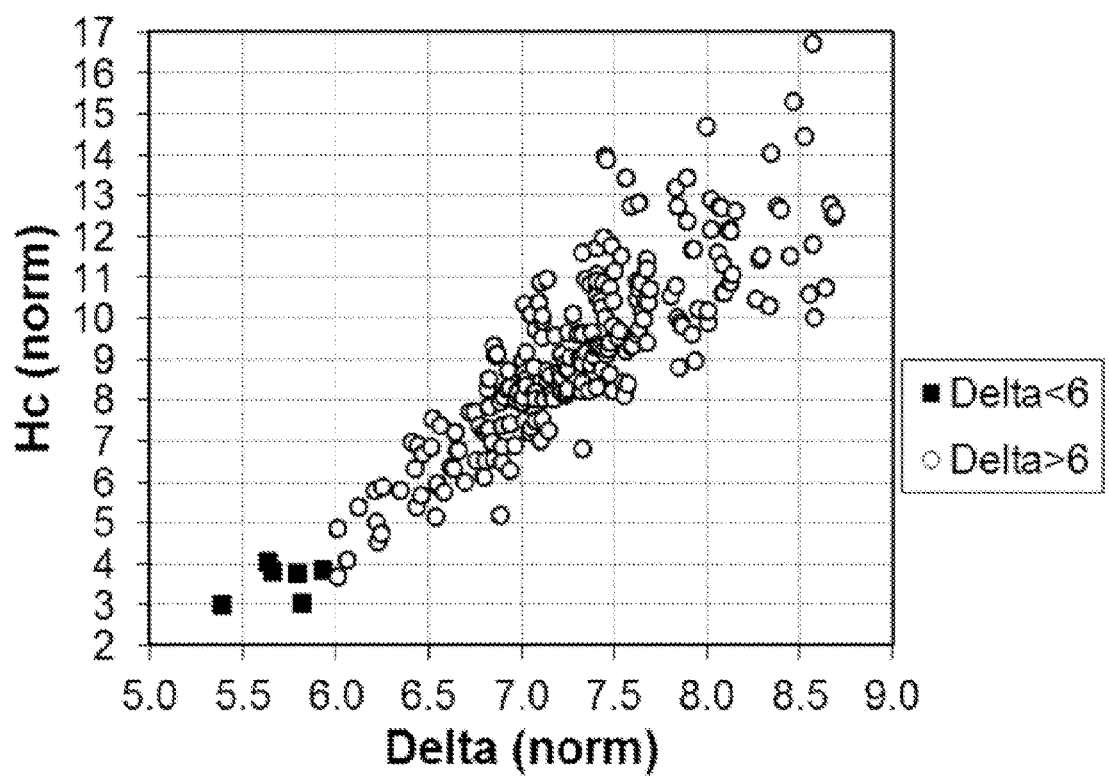
FIG. 2 shows a graphical plot of the experimental measurement results of normalized coercivity (Hc) correlation to the normalized thermal stability factor (delta) of MTJ cells in an MRAM chip.
Figure 3:
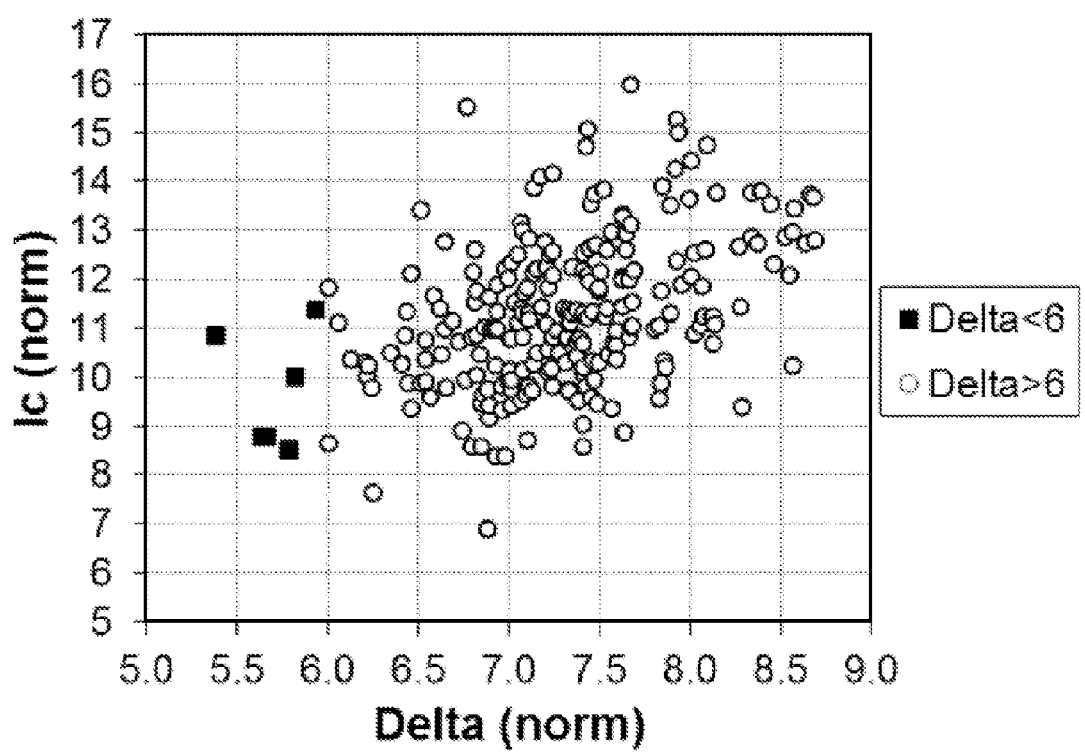
FIG. 3 shows a graphical plot of the normalized switching current (Ic) of the same MTJ cells in the correlation to normalized delta plot in FIG. 2.

FIG. 2 shows the experimental measurement results of normalized coercivity (Hc) correlation to the normalized thermal stability factor (delta) of MTJ cells in an MRAM chip. FIG. 3 shows the normalized switching current (Ic) of the same MTJ cells in correlation to normalized delta as in FIG. 2. Although switching current is a parameter easy to obtain in normal testing of memory chips, the lack of correlation between Ic level and delta established in FIG. 3 shows that Ic level cannot be used to screen out low thermal stability, e.g. delta<6 cells. There are too many good, healthy cells (e.g. delta>6) that have Ic that is the same or lower than the low delta cells. Regardless of the cutoff level selected for Ic, an unacceptably high number of good cells would be screened out resulting in low yields.

However, FIG. 2 shows strong correlation between Hc, i.e. the magnetic field required to switch the MTJ cells, and delta. Therefore, by using a magnetic field that can switch all the MTJ cells with an Hc below a selected value (for example, Hc<4.5 for the sample population of FIG. 2) the low delta (<6) cells will be screened out with minimal healthy cells being included in the rejects. A method that combines a selected low external magnetic field that will switch the low Hc MTJ cells with reading the MTJ cell contents by resistance state mapping can effectively screen out low delta cells using Hc as a proxy. A similar method finds the high delta cells by applying a selected high external magnetic field that should switch all normal MTJ cells and reading the MTJ cell contents by resistance state mapping. The high delta cells may have a high probability of not switching during standard electrical current programming.

In the various embodiments described below any of the applied magnetic fields can be a DC magnetic field or a series of pulsed magnetic fields applied in same direction. The tests can also be performed concurrently on one or more wafers or concurrently on one or more chips. The magnetic layers in the MTJ cells can have in-plane magnetizations or magnetizations perpendicular to film without affecting the substance of the method, i.e. only the direction of the applied fields changes. When the tests begin the resistance state of each cell, which is controlled by the magnetic orientation of the free layer, is unknown and can be random. When the first externally generated magnetic field is applied to the MRAM device to set the magnetic direction of the free layer in cells with a selected characteristic, some of the free layers may already be in the magnetic direction in line with the magnetic field and, therefore, do not switch. For the sake of brevity in the following description the all of the selected cells in a device will be described as switching in accordance with the applied field. This language should be understood to encompass the cases where some or all of the cells are already in the target state and, therefore, do not actually switch states. The population of cells in the test set will be described as falling into three categories: low delta, normal delta and high delta. The normal cells are those are usable and presumably within the design specifications. The normal cells are expected to be a plurality of the cells in the devices with low and high delta cells being the tails of the distribution. The precise cutoff points for defining low and high delta cells should be determined empirically based on the typical manufacturing principles.

For the embodiments described below that address only low delta cells, e.g. such as in FIGS. 4A-C & 5A-C, any high delta cells that exist should be screened out before beginning the testing for low delta cells. Therefore, high delta or non-switchable cells are either assumed not to exist or they are already screened out by some other methods, for example, pre-testing with electrical writing methods that detect non-switchable cells as in FIGS. 6A-6C or FIGS. 8A-8B.

Figure 4A:
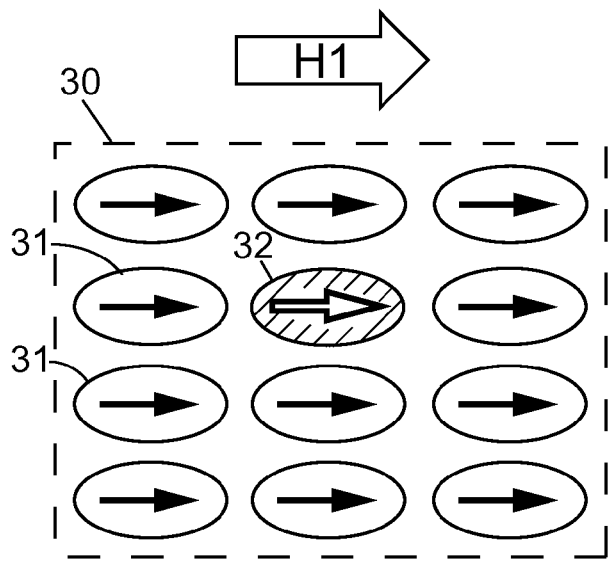
FIGS. 4A-C illustrate selected stages of the memory cells under test in an embodiment of the invention that identifies low delta cells by applying selected H1 and H2 fields.
Figure 4B:
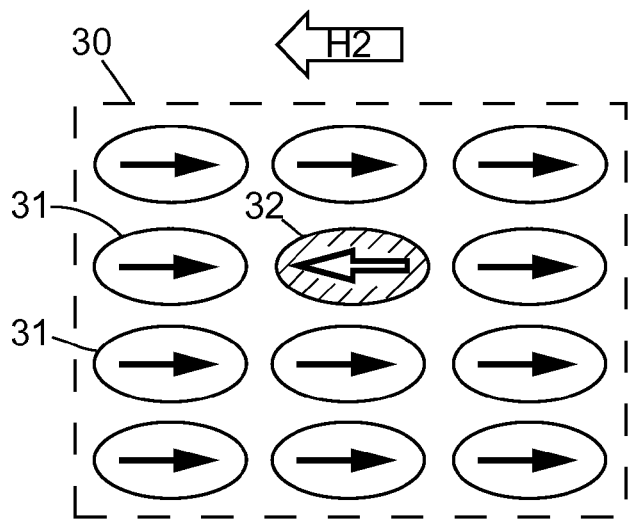
Figure 4C:
Figure 4C:
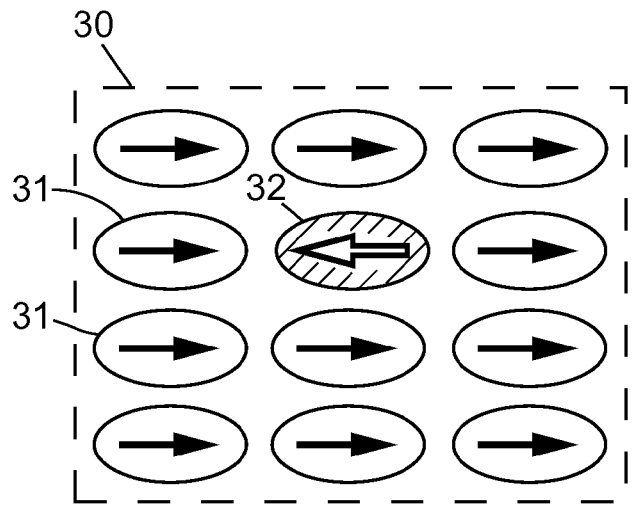
Figure 9:
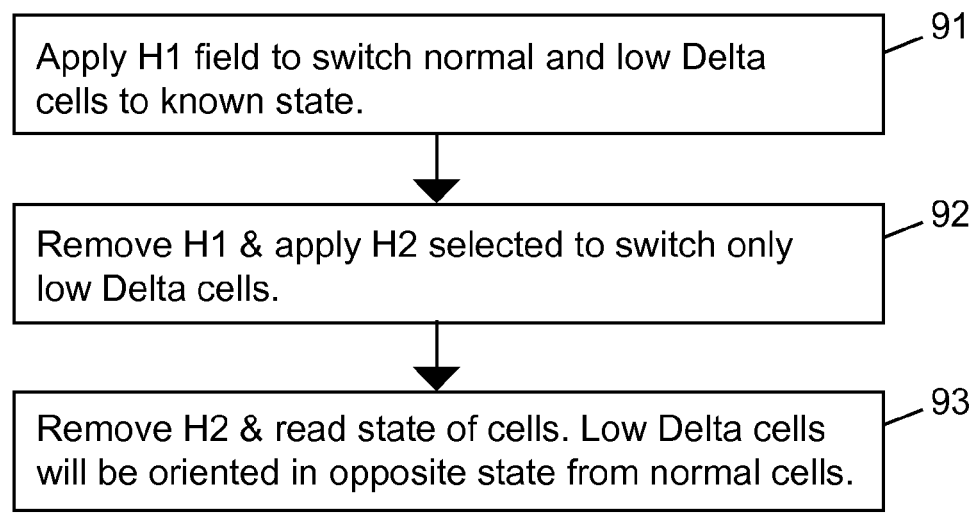
FIG. 9 illustrates selected stages in a method embodiment of the invention that identifies low delta cells by applying selected H1 and H2 fields.

FIGS. 4A-4C illustrate an embodiment of the invention that finds the low delta cell 32 in MRAM chip 30 from among the normal cells 31. Only 12 cells are shown to illustrate the concepts but actual production chips will have a much larger number of cells. FIG. 9 illustrates selected stages in a method embodiment corresponding to FIGS. 4A-4C. FIG. 4A illustrates that in the first phase a first selected external magnetic field H1 is applied to the entire MRAM chip 30. The H1 field is selected with the proper strength and oriented in the proper direction to switch the free layers in the low delta and normal MTJ cells into a known state 91, which can be either the high or low resistance state. In one alternative embodiment, the field H1 is selected to be just high enough so that only the low delta cells 32 and normal cells 31 switch, but the state of any high delta cells will be unchanged. As noted above, the high delta cells should be non-existent or already identified or mapped out using some other methods. In another alternative case, the field H1 is set high enough to switch all existing cells, including low delta cells, normal cells and high delta cells all together.

Regardless of which selected level of strength of the H1 field is used, the method continues as follows. The H1 field is removed and a second field H2 is applied to the MRAM chip 92. The H2 field is lower in strength than H1 and is oriented in the opposite direction to H1. The H2 field is selected to be able to switch only the low delta MTJ cells such as cell 32. Therefore, after H2 has been applied in FIG. 4B and then removed in FIG. 4C, the normal cells 31 remain in the first state (which is shown by arrows pointing to the right in the figures). But the low delta MTJ cell 32 has been switched to the second resistance state (which is shown by an arrow pointing to the left in the figures). The state of the cells (high or low resistance) in FIG. 4C can be read using the standard reading circuitry in the MRAM and the defective low delta cell 32 can be identified by not being in the same state as the normal cells 93. The defective cells can be recorded and bypassed using prior art techniques for mapping defective cells and reconfiguring cell organization.

Figure 5A:
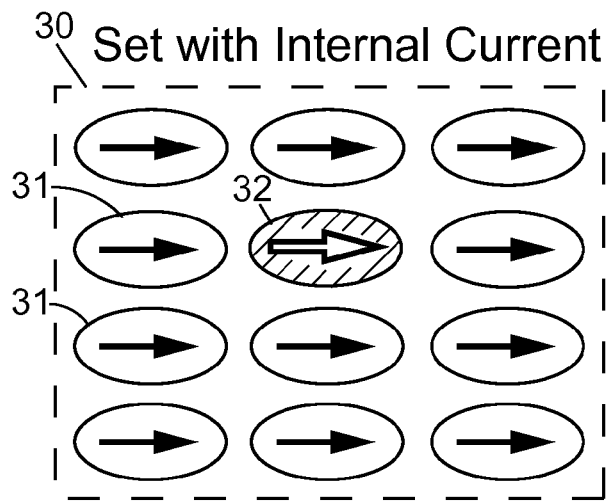
FIGS. 5A-C illustrate selected stages of the memory cells under test in an embodiment of the invention that identifies low delta cells by initially writing the memory cells under test using electric current then applying the selected H2 field.
Figure 5B:
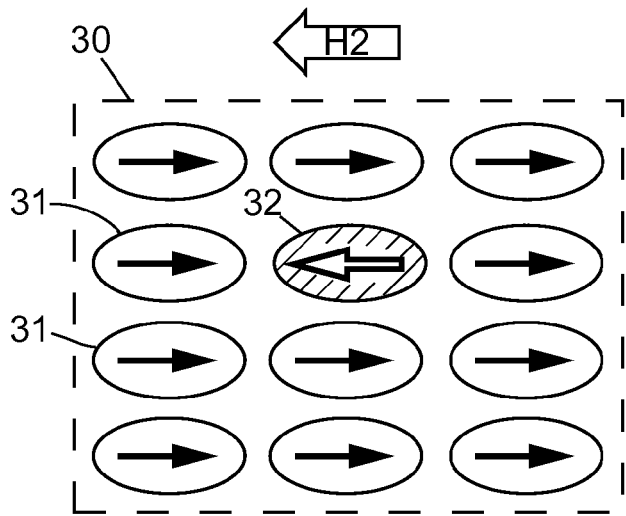
Figure 5B:
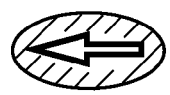
Figure 5C:
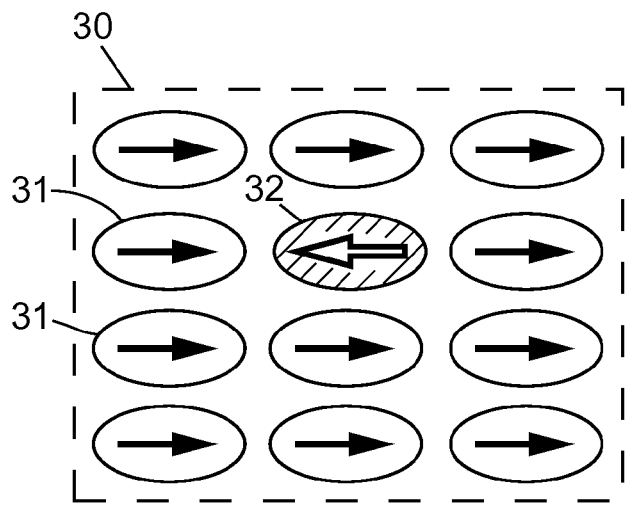
Figure 10:
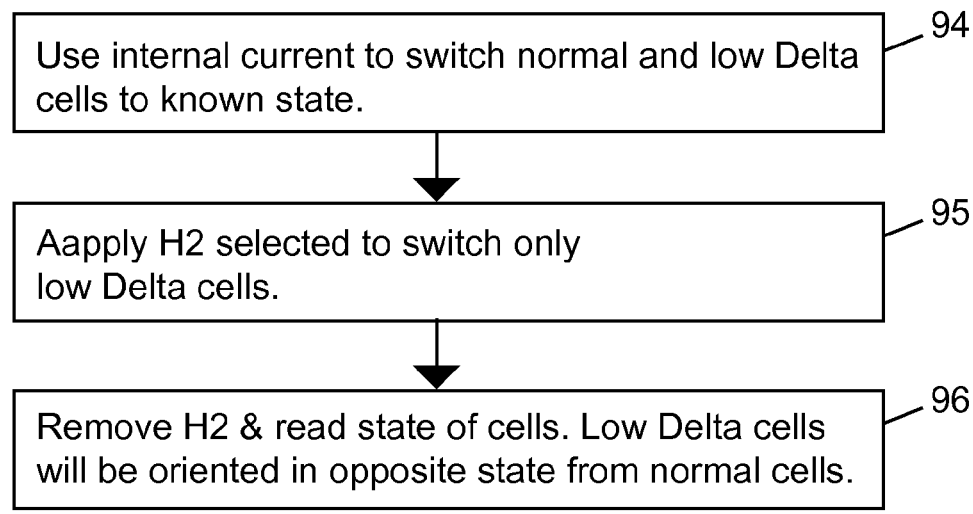
FIG. 10 illustrates selected stages in a method embodiment of the invention that identifies low delta cells by initially writing the cells memory cells under test using electric current then applying the selected H2 field.

FIG. 5A-5C illustrate selected stages of the memory cells under test in an embodiment of the invention that identifies low delta cells by initially writing the cells memory cells under test using electric current then applying the selected H2 field. Again in this case, the high delta (non-switchable) cells should be non-existent or already identified or mapped out using some other methods. FIG. 10 illustrates selected stages in a method embodiment corresponding to FIGS. 5A-5C. The circuit's normal internally generated write current can be used in this test to initialize the state of the cells as shown in FIG. 5A. The electric current should bring the low delta and normal cells (a plurality of MTJ cells) into a known state with a known resistance 94. The low delta cell 32 will switch along with the normal cells 31. After the initial writing phase, the selected H2 field is applied 95 in FIG. 5B just as was described above for the embodiment of FIGS. 4B and 9. The H2 field can be the same in each of the embodiments directed at the low delta cells. Therefore, after H2 has been applied in FIG. 5B and then removed in FIG. 5C, the normal cells 31 remain in the first state (which is shown by arrows pointing to the right in the figures). But the low delta MTJ cell 32 has been switched to the second resistance state (which is shown by an arrow pointing to the left in the figures). The state of the cells (high or low resistance) in FIG. 5C can be read using the standard reading circuitry in the MRAM, and the defective low delta cell 32 can be identified by not being in the same state as the normal cells 96. The defective cells can be recorded and bypassed as described above.

Figure 6A:
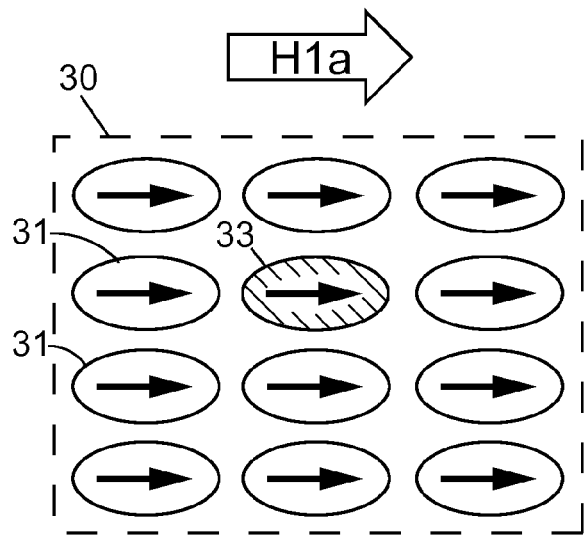
FIGS. 6A-C illustrate selected stages of the memory cells under test in an embodiment of the invention that identifies high delta cells by applying selected H1a and H2a fields.
Figure 6B:
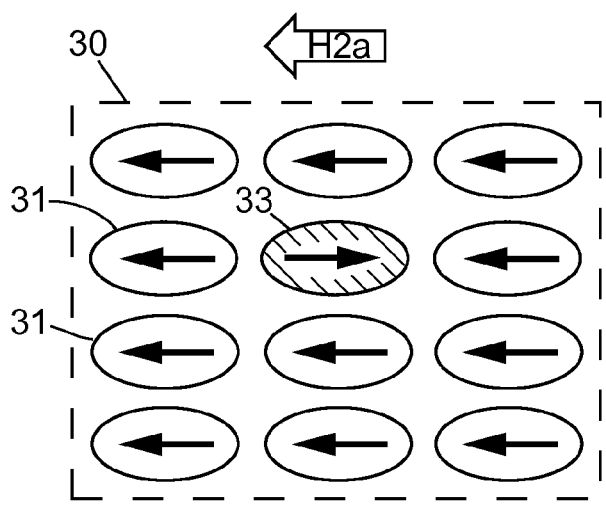
Figure 6C:
Figure 6C:
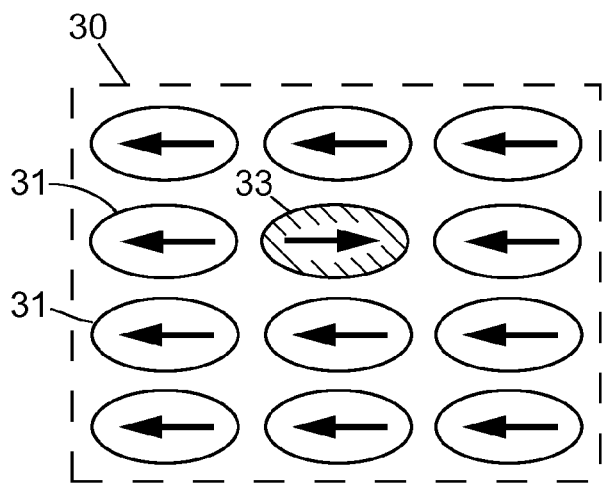
Figure 11:
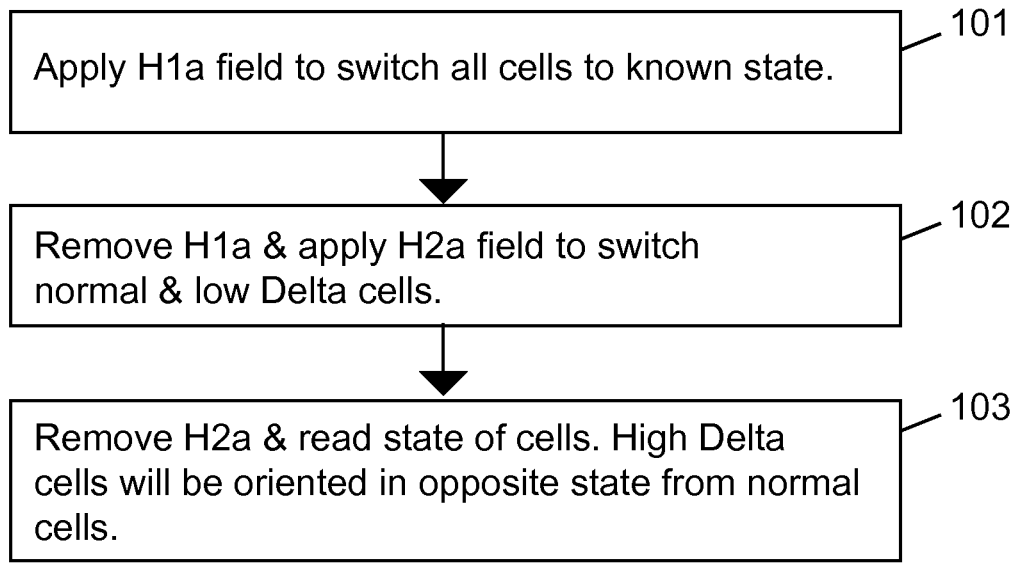
FIG. 11 illustrates selected stages in a method embodiment of the invention that identifies high delta cells by applying selected H1a and H2a fields.

FIG. 6A-6C illustrate selected stages of the memory cells under test in an embodiment of the invention that identifies high delta cells by applying selected H1a and H2a fields. FIG. 11 illustrates selected stages in a method embodiment corresponding to FIGS. 6A-6C. In this embodiment first applied field H1a is selected to be high enough to bring all MTJ cells (including the high delta cells 33) into a first known state with a first known MTJ resistance 101 as shown in FIG. 6A. Heating may be applied to the MRAM chip during H1a magnetic field application to assist in switching the high coercivity cells. After the H1a field has been removed, the second field H2a is applied to the MRAM chip 102. The H2a field is lower than and opposite in direction to the H1a field, and is selected to switch the normal MTJ cells into the second resistance state. The low delta cells will switch as well, but the high delta cells 33 will not switch because the H2a is lower than these cells' Hc. From this stage the method continues as in the previous embodiments with the external field H2a being removed, and the state of the cells is read by electrical measurement 103. As shown in FIG. 6C the high delta cell 33 is in the opposite state from the normal cells and can be identified.

Figure 7A:
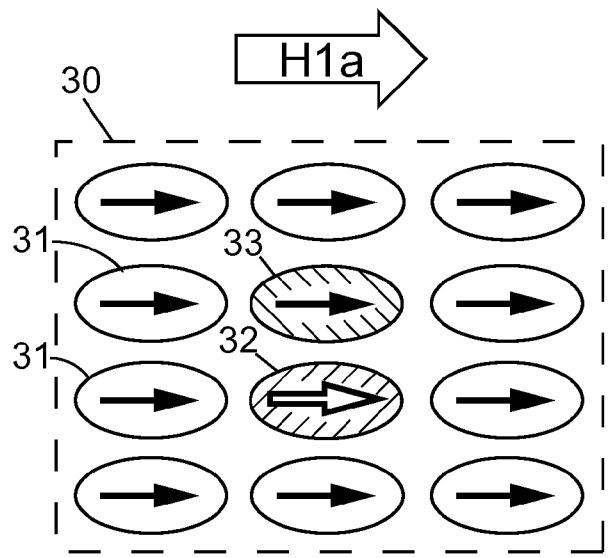
FIGS. 7A-C illustrate selected stages of the memory cells under test in an embodiment of the invention that identifies both high and low delta cells by applying selected H1a, H2a and H3 fields.
Figure 7B:
Figure 7B:
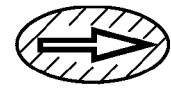
Figure 7B:
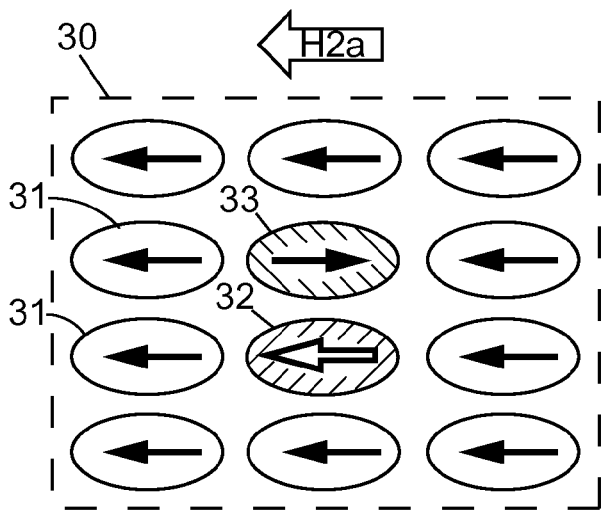
Figure 7C:
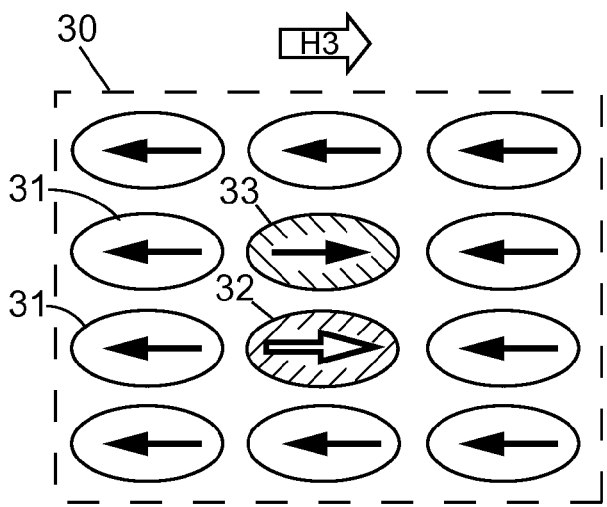
Figure 12:
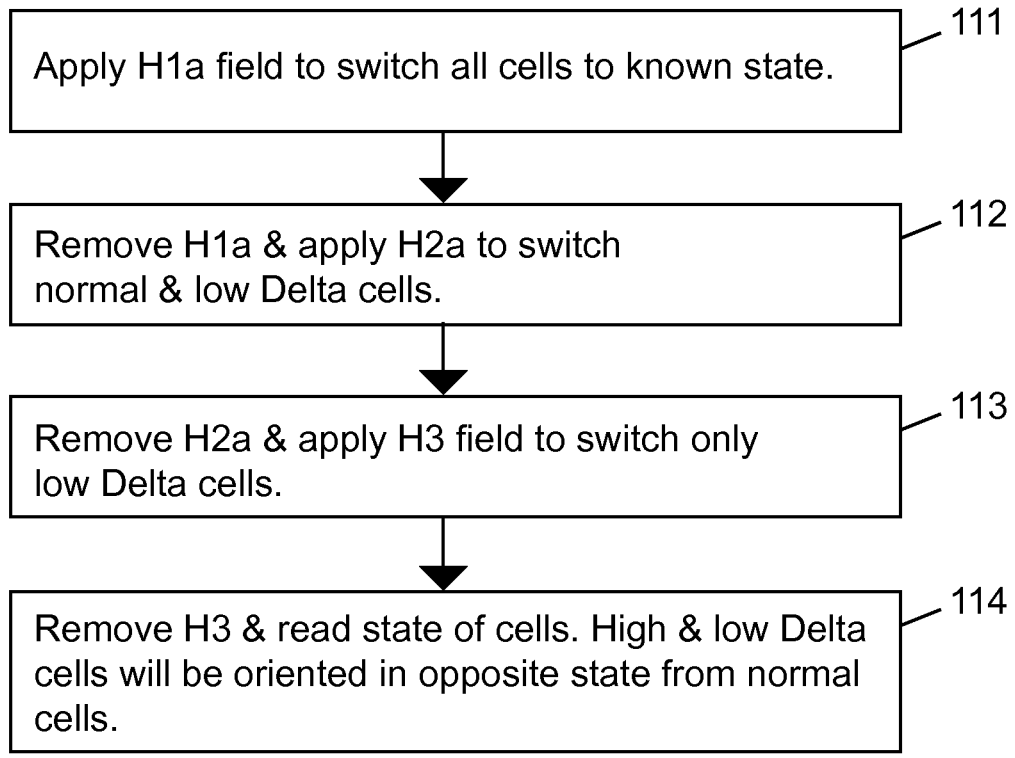
FIG. 12 illustrates selected stages in a method embodiment of the invention that identifies both high and low delta cells by applying selected H1a, H2a and H3 fields.

FIGS. 7A-7C illustrate selected stages of the memory cells under test in an embodiment of the invention that identifies both high and low delta cells by applying selected H1a, H2a and H3 fields. FIG. 12 illustrates selected stages in a method embodiment corresponding to FIGS. 7A-7C. As in the previous embodiment the first field H1a is applied 111, which is selected to be high enough to bring all MTJ cells into a known state with a known MTJ resistance as shown in FIG. 7A. Heating may be applied to the MRAM chip during H1a magnetic field application to assist in switching the high coercivity cells. After field H1a is removed, the second field H2a is applied 112, which is lower than and opposite to H1a, and is selected to switch the normal MTJ cells into the second resistance state. Again the low delta cells will switch as well as shown in FIG. 7B, but the high delta cell 33 will not switch because the H2a is lower than this cell's Hc. The H2a field is removed and the H3 field is applied 113 as shown in FIG. 7C. The H3 field is selected to serve the same function as the H2 in the embodiments of FIGS. 4B and 5B. Therefore, H3 is selected to switch the low delta cells 32 while leaving normal cells 31 and high delta cells 33 unchanged as shown in FIG. 7C. From this stage the method continues as in the previous embodiments with the external field H3 being removed, and the state of the cells remains as shown in FIG. 7C. The state of the cells is read by electrical measurement 114. As shown in FIG. 7C both the low delta cell 32 and the high delta cell 33 are in the opposite state from the normal cells and can be identified.

Figure 8A:
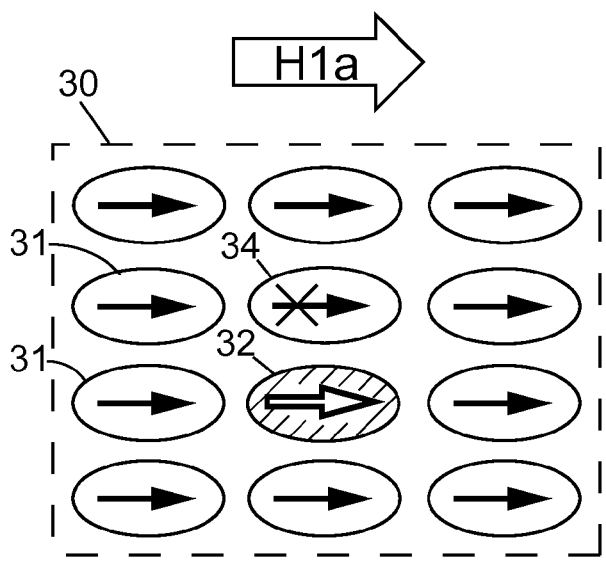
FIGS. 8A-C illustrate selected stages of the memory cells under test in an embodiment of the invention that identifies both non-switchable and low delta cells by applying the selected H1a field, switching the cells using electrical current and applying the selected H3 field.
Figure 8B:
Figure 8B:
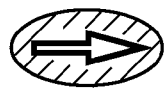
Figure 8B:
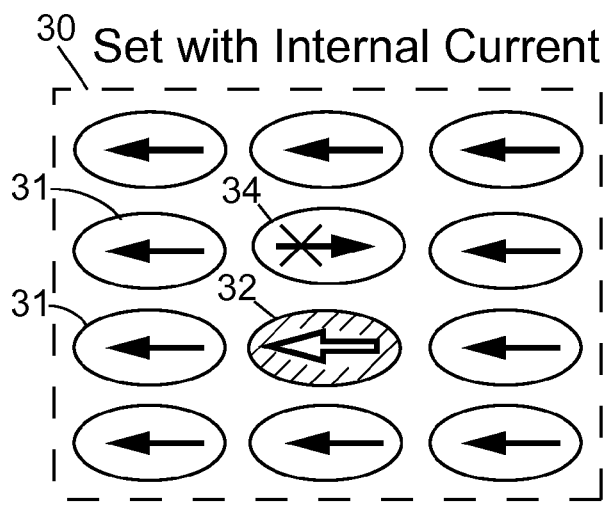
Figure 8C:
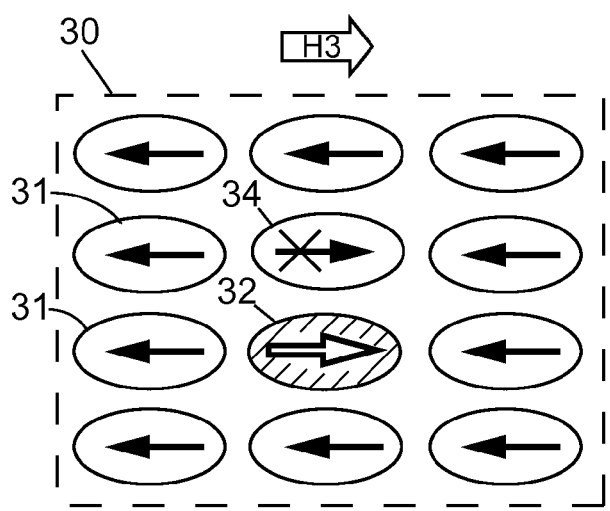

FIGS. 8A-8C illustrate selected stages of the memory cells under test in an embodiment of the invention that is similar to the embodiment of FIGS. 7A-7C except that the role of the H2a is performed using the internal electrical write current to switch all of the cells that are switchable (writable) by the internal electrical current. The cells that are not switchable by the internal electrical current and are unwritable will be called "non-switchable." The non-switchable cells 34 include the high delta cells but can also include cells with other types of defects. For example, defects that cause partial write current shunting can cause the cell to not be writable by normal operational current and, therefore, to fall into the non-switchable group along with high delta cells. However, the non-switchable cells such as partially shunted cells (that are not high delta cells) might be switched by an externally applied magnetic field that would not switch high delta cells.

Figure 13:
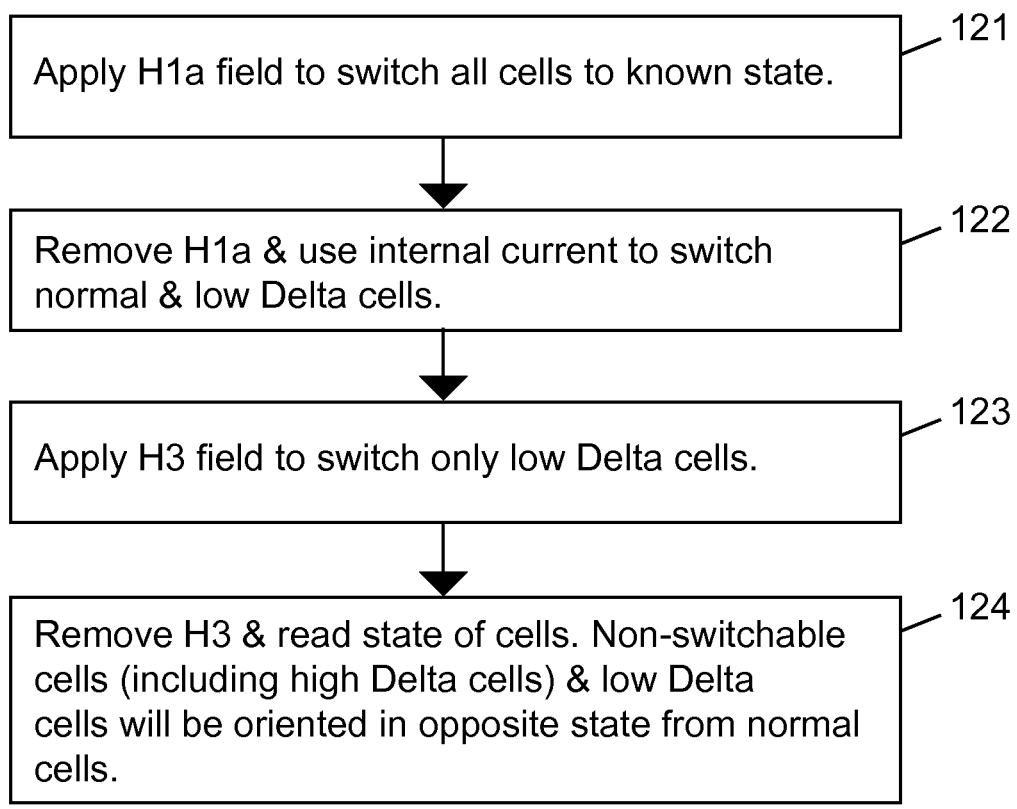
FIG. 13 illustrates selected stages in a method embodiment of the invention that identifies both non-switchable and low delta cells by applying the selected H1a field, switching the cells using electrical current and applying the selected H3 field.

The embodiment illustrated in FIGS. 8A-8C identifies both non-switchable and low delta cells by applying the selected H1a field, setting the cells using electrical current and applying the selected H3 field. FIG. 13 illustrates selected stages in a method embodiment corresponding to FIGS. 8A-8C. As in the previous embodiment of FIGS. 7A-7C the first field H1a is applied 121, which is selected to be high enough to bring all MTJ cells into a known state with a known MTJ resistance as shown in FIG. 8A. After field H1a is removed, the circuit's normal internally generated write current can be used to switch the state of the cells 122 as shown in FIG. 8B. The electric current will switch all of the normal cells 31 into the opposite resistance state. The low delta cell 32 will switch along with the normal cells 31. The non-switchable cells 34, including high delta cells, remain unchanged after electric current writing. Next as shown in FIG. 8C, field H3 is applied 123 which, as described above, is selected to switch the low delta cells 32 while leaving normal cells 31 and non-switchable cells 34 unchanged. From this stage the method continues as in the previous embodiments with the external field H3 being removed, and the state of the cells remains as shown in FIG. 8C. The state of the cells is read by standard electrical measurement 124. As shown in FIG. 8C both the low delta cell 32 and the high delta cell 33 are in the opposite state from the normal cells 31 and can be identified.

Although the present invention has been described in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

The invention claimed is:

1. A method for testing cells in an MRAM device for abnormal thermal stability factor (delta) using coercivity as a proxy, the MRAM device having a plurality of cells that have a low resistance state and a high resistance state, the method comprising:
   initializing low coercivity cells and normal coercivity cells into a first resistance state;
   applying an externally generated low-strength magnetic field to the MRAM device, the low-strength magnetic field having a strength and direction selected to only switch low coercivity cells into the second resistance state and to leave the normal coercivity cells in the first resistance state;
   removing the magnetic field; and
   determining a failing set of cells as including cells that are in the second resistance state.

2. The method of claim 1 wherein initializing low coercivity cells and normal coercivity cells into the first resistance state further comprises applying an externally generated first magnetic field to the MRAM device to force a plurality of the cells into the first resistance state, the first magnetic field having a first strength and a first direction selected to switch low coercivity cells and normal coercivity cells into the first resistance state; and then removing the first magnetic field.

3. The method of claim 2 wherein applying the externally generated first magnetic field further comprises applying a series of pulsed magnetic fields.

4. The method of claim 1 wherein initializing low coercivity cells and normal coercivity cells into the first resistance state further comprises using an electric current flowing through each cell to set each low coercivity cell and normal coercivity cell into the first resistance state.

5. The method of claim 1 wherein the cells include MTJ elements that have a magnetization direction perpendicular to a film surface.

6. The method of claim 1 wherein the cells include MTJ elements that have a magnetization direction in a plane of a film surface.

7. A method for testing cells in an MRAM device for abnormal thermal stability factor (delta) using coercivity as a proxy, the MRAM device having a plurality of cells that have a low resistance state and a high resistance state, the plurality of cells having varying coercivity that includes low coercivity cells, normal coercivity cells and high coercivity cells, the method comprising:

initializing low coercivity cells, normal coercivity cells and high coercivity cells into a first resistance state by applying an externally generated first magnetic field to the MRAM device to force a plurality of the cells into the first resistance state, the first magnetic field having a first strength and a first direction selected to switch low, normal and high coercivity cells into the first resistance state;

removing the first magnetic field;

applying an externally generated second magnetic field to the MRAM device, the second magnetic field having a second strength and a second direction selected to only switch normal and low coercivity cells into the second resistance state and to leave the high coercivity cells in the first resistance state;

removing the second magnetic field; and determining a failing set of cells as including cells that are in the first resistance state.

8. The method of claim 7 wherein applying the externally generated first magnetic field further comprises applying a series of pulsed magnetic fields.

9. The method of claim 7 wherein applying the externally generated first magnetic field further comprises heating the MRAM device to assist in switching the high coercivity cells.

10. The method of claim 7 wherein the cells include MTJ elements that have a magnetization direction perpendicular to a film surface.

11. The method of claim 7 wherein the cells include MTJ elements that have a magnetization direction in a plane of a film surface.

12. A method for testing cells in an MRAM device for abnormal thermal stability factor (delta) using coercivity as a proxy, the MRAM device having a plurality of cells that have a low resistance state and a high resistance state, the plurality of cells having varying coercivity that includes low coercivity cells, normal coercivity cells and high coercivity cells, the method comprising:

initializing low coercivity cells, normal coercivity cells and high coercivity cells into a first resistance state by applying an externally generated first magnetic field to the MRAM device to force a plurality of the cells into the first resistance state, the first magnetic field having a first strength and a first direction selected to switch low, normal and high coercivity cells into the first resistance state;

removing the first magnetic field;

applying an externally generated second magnetic field to the MRAM device, the second magnetic field having a second strength and a second direction selected to only switch normal and low coercivity cells into the second resistance state and to leave the high coercivity cells in the first resistance state;

removing the second magnetic field;

applying an externally generated third magnetic field to the MRAM device, the third magnetic field having a third strength and a third direction selected to only switch low coercivity cells into the first resistance state and to leave the normal coercivity cells in the second resistance state; and determining a failing set of cells as including cells that are in the first resistance state.

13. The method of claim 12 wherein applying the externally generated first magnetic field further comprises applying a series of pulsed magnetic fields.

14. The method of claim 12 wherein applying the externally generated first magnetic field further comprises heating the MRAM device to assist in switching the high coercivity cells.

15. The method of claim 12 wherein the cells include MTJ elements that have a magnetization direction perpendicular to a film surface.

16. The method of claim 12 wherein the cells include MTJ elements that have a magnetization direction in a plane of a film surface.

17. A method for testing cells in an MRAM device for abnormal thermal stability factor (delta) using coercivity as a proxy, the MRAM device having a plurality of cells that are switchable between a low resistance state and a high resistance state using electric current generated by circuitry in the MRAM device, the plurality of cells including low coercivity cells, normal coercivity cells and high coercivity cells, the method comprising:

applying an externally generated first magnetic field to the MRAM device to force a plurality of the cells into a first resistance state, the first magnetic field having a first strength and a first direction selected to switch low, normal and high coercivity cells into the first resistance state;

removing the first magnetic field;

driving a selected electric current through each cell using circuitry in the MRAM device to switch a plurality of the cells into the second resistance state;

applying an externally generated second magnetic field to the MRAM device, the second magnetic field having a second strength and a second direction selected to only switch low coercivity cells into the first resistance state and to leave the normal coercivity cells in the second resistance state; and determining a failing set of cells as including cells that are in the first resistance state.

18. The method of claim 17 wherein applying the externally generated first magnetic field further comprises applying a series of pulsed magnetic fields.

19. The method of claim 17 wherein applying the externally generated first magnetic field further comprises heating the MRAM device to assist in switching the high coercivity cells.

20. The method of claim 17 wherein the cells include MTJ elements that have a magnetization direction perpendicular to a film surface.

21. The method of claim 17 wherein the cells include MTJ elements that have a magnetization direction in a plane of a film surface.

* * * * *